United States Patent
Watadani et al.

(10) Patent No.: US 7,233,003 B2
(45) Date of Patent: Jun. 19, 2007

(54) RADIATION DETECTOR

(75) Inventors: Koji Watadani, Kyoto-fu (JP); Kenji Sato, Shiga-ken (JP); Yoichiro Shimura, Yamanashi-ken (JP); Hideo Tsuruta, Yamanashi-ken (JP)

(73) Assignees: Shimadzu Corporation (JP); Shindengen Electric Manufacturing Co., Ltd (JP); Shindengen Sensor Device Co., Ltd (JP)

( * ) Notice: Subject to any disclaimer, the term of this patent is extended or adjusted under 35 U.S.C. 154(b) by 274 days.

(21) Appl. No.: 10/942,846

(22) Filed: Sep. 17, 2004

(65) Prior Publication Data

US 2005/0061987 A1    Mar. 24, 2005

(30) Foreign Application Priority Data

Sep. 24, 2003  (JP)  ............................. 2003-331781

(51) Int. Cl.
  *G01T 1/00*    (2006.01)
(52) U.S. Cl. ..................... 250/370.08; 250/370.01; 250/370.05; 250/370.09
(58) Field of Classification Search ........... 250/370.08, 250/370.05
See application file for complete search history.

(56) References Cited

U.S. PATENT DOCUMENTS 5,396,072 A * 3/1995 Schiebel et al. ....... 250/370.09
5,578,814 A * 11/1996 Dadali et al. ............ 250/208.1
6,895,077 B2 * 5/2005 Karellas et al. ............ 378/98.3
2001/0020683 A1* 9/2001 Teranuma et al. ..... 250/370.09
2003/0034464 A1* 2/2003 Ogawa ....................... 250/580

FOREIGN PATENT DOCUMENTS

EP      1009038 A2 *  6/2000
JP    2001-026443 A1    1/2001

* cited by examiner

*Primary Examiner*—Albert J. Gagliardi
*Assistant Examiner*—Djura Malevic
(74) *Attorney, Agent, or Firm*—Rader, Fishman & Grauer PLLC (57) ABSTRACT

The radiation detector according to this invention has a common electrode for bias voltage application formed on a surface of an amorphous selenium semiconductor film (a-Se semiconductor film) sensitive to radiation. The common electrode is a gold thin film having a thickness in a range of 100 to 1,000 Å. The gold thin film acting as the common electrode may be formed on the surface of the a-Se semiconductor film at a relatively low vapor deposition temperature and in a reduced vapor deposition time. This feature suppresses a generation of defects in the a-Se semiconductor film due to formation of the common electrode. The gold thin film for the common electrode is not so thick as in the prior art, but is 1,000 Å or less. With the reduced thickness, the common electrode has improved boding property with respect to the a-Se semiconductor film.

19 Claims, 4 Drawing Sheets

RADIATION DETECTOR

BACKGROUND OF THE INVENTION (1) Field of the Invention

This invention relates to radiation detectors of the direct conversion type including an amorphous selenium semiconductor film (hereinafter referred to as "a-Se semiconductor film" where appropriate) sensitive to radiation, for use in the medical, industrial, nuclear and other fields.

(2) Description of the Related Art

Figure 1:
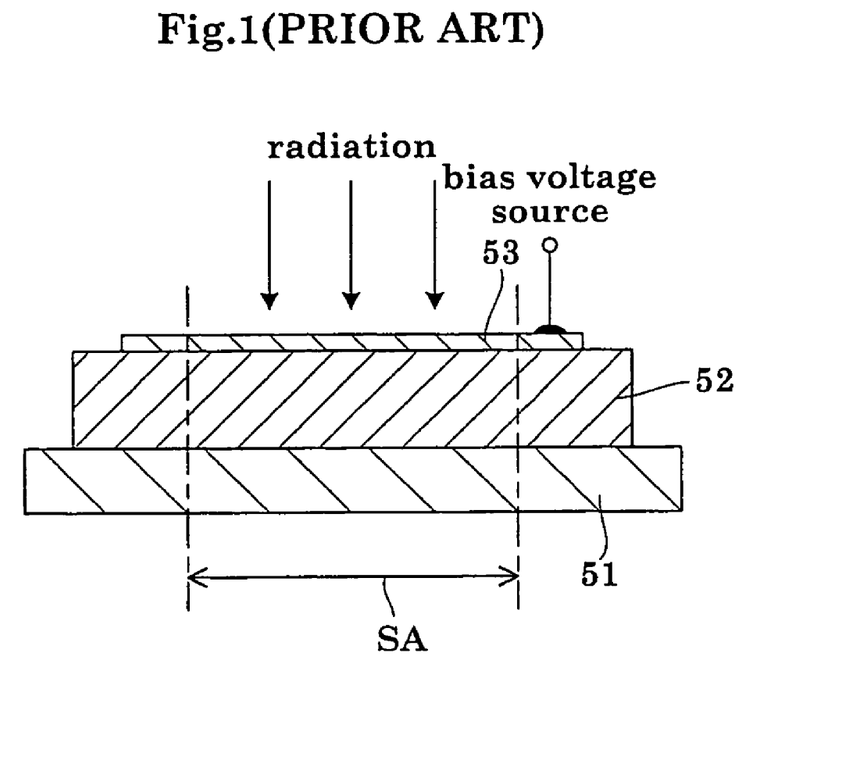
FIG. 1 is a sectional view showing a basic structure of a conventional radiation detector.

An indirect conversion type radiation detector first converts radiation (e.g. X rays) into light, and then converts the light into electric signals by photoelectric conversion. As distinct from the indirect conversion type, a direct conversion type radiation detector converts incident radiation (e.g. X rays) directly into electric signals (charges) by an a-Se semiconductor film sensitive to radiation. FIG. 1 is a schematic sectional view showing a basic construction of a conventional radiation detector of the direct conversion type.

The radiation detector shown in FIG. 1 includes an active matrix substrate 51, a radiation sensitive a-Se semiconductor film 52, and a common electrode 53 for bias voltage application. Numerous collecting electrodes (not shown) are formed on the surface of the active matrix substrate 51, in a two-dimensional matrix arrangement set within a radiation detection effective area SA. An electric circuit (not shown) is arranged on the surface of the active matrix substrate 51 for storing and reading electric charges collected by the respective collecting electrodes upon incidence of radiation. The radiation sensitive a-Se semiconductor film 52 is laid on the surface of the active matrix substrate 51 where the collecting electrodes are formed, to generate charges upon incidence of the radiation. The common electrode 53 for bias voltage application is formed two-dimensionally on the front surface of the a-Se semiconductor film 52.

In time of radiation detection by the conventional radiation detector, a bias voltage is applied from a bias voltage source to the common electrode 53. With the bias voltage applied, electric charges are generated in the radiation sensitive a-Se semiconductor film 52 upon incidence of the radiation. The electric charges generated in the a-Se semiconductor film 52 are collected by the collecting electrodes. The electric charges collected by the collecting electrodes are fetched as radiation detection signals from the respective collecting electrodes by the storing and reading electric circuit including capacitors, switching elements and electric wires.

That is, in the direct conversion type radiation detector shown in FIG. 1, each of the collecting electrodes in the two-dimensional matrix arrangement acts as an electrode corresponding to each pixel in a radiographic image (pixel electrode). Radiation detection signals obtained can be used to create a radiographic image according to a two-dimensional intensity distribution of the radiation projected to the radiation detection effective area SA.

The radiation sensitive a-Se semiconductor film 52 having a large area may be formed by PVD (Physical vapor deposition), typically, for example, vacuum deposition. Thus, the radiation detector can easily secure a large radiation detection effective area SA. In the case of the conventional radiation detector, as shown in Japanese Unexamined Patent Publication No. 2001-26443, the common electrode 53 for bias voltage application formed on the a-Se semiconductor film 52 comprises an aluminum or MgAg film of about 100 nanometers (nm) (=1,000 angstroms).

However, the conventional radiation detector with the above construction has a drawback that defects could occur with the radiation sensitive a-Se semiconductor film 52 when the a-Se semiconductor film 52 is damaged by the heat of vapor deposition for forming the common electrode 53 for bias voltage application on the a-Se semiconductor film 52. The a-Se semiconductor film 52 with many defects lacks in long-term reliability, and detection errors caused by the defects result in low-quality radiographic images.

Further, the conventional radiation detector has a drawback of being low in bonding strength between the radiation sensitive a-Se semiconductor film 52 and common electrode 53 for bias voltage application. Where an aluminum or MgAg film of about 100 nanometers (nm) (=1,000 angstroms) is used, the common electrode 53 has a weak bonding strength, and hence low reliability.

SUMMARY OF THE INVENTION

This invention has been made having regard to the state of the art noted above, and its object is to provide a radiation detector that can suppress a generation of defects in an amorphous selenium semiconductor film resulting from lamination thereon of a common electrode for bias voltage application, and can improve the bonding property of the common electrode.

The above object is fulfilled, according to this invention, by a radiation detector having an amorphous selenium semiconductor film sensitive to radiation, and a common electrode for bias voltage application formed two-dimensionally on a front surface of the radiation sensitive amorphous selenium semiconductor film, electric charges being generated in the radiation sensitive amorphous selenium semiconductor film upon incidence of radiation to be detected, with a bias voltage applied to the common electrode:

wherein the common electrode comprises a gold thin film (Au thin film) having a thickness of 100 to 1,000 angstroms.

When the radiation detector according to this invention detects radiation, a bias voltage is applied to the common electrode formed on the front surface of the radiation sensitive amorphous selenium semiconductor film. With the bias voltage applied, the amorphous selenium semiconductor film, upon incidence of the radiation to be detected, generates electric charges as sources of radiation detection signals. The amorphous selenium semiconductor film has an excellent aptitude for increased area, and can therefore secure a large radiation detection effective area with ease.

In the radiation detector according to this invention, the common electrode comprises a gold thin film having a thickness of 1,000 angstroms (Å) or less. The gold thin film forming the common electrode may be laminated on the front surface of the amorphous selenium semiconductor film at a relatively low vapor deposition temperature and in a short vapor deposition time. This results in a reduced chance of causing defects in the amorphous selenium semiconductor film. That is, gold used as the material for forming the common electrode has a low melting point, and thus does not require a high vapor deposition temperature. Gold has a very high degree of conductivity, and the conductivity required of the common electrode may be secured even with a 100 Å gold thin film accompanied by an increase in electrode resistance, and thus requires only a short vapor deposition time. Since the amorphous selenium semiconductor film is a film of high resistance, the resistance of the common electrode increases somewhat. However, this presents no problem electrically, in view of the conductivity of gold.

Further, the gold thin film forming the common electrode is not so thick as in the prior art, but is very thin, i.e. 1,000 Å or less. Thus, the common electrode has an improved bonding property with respect to the amorphous selenium semiconductor film.

Platinum (Pt) has the advantage of requiring only a low vapor deposition temperature, as does gold. However, platinum has a low conductivity of about one fifth that of gold. When used as the material for the common electrode, platinum must be deposited thick in order to secure the conductivity required of the common electrode. This results in an extended vapor deposition time, thereby causing defects in the amorphous selenium semiconductor film. In addition, the film will become thick and the common electrode will have an unsatisfactory boding property. Such problems are solved by the common electrode comprising a god thin film.

Preferably, the above gold thin film forming the common electrode has a thickness in a range of 450 to 550 angstroms.

The gold thin film forming the common electrode, even when formed thick, should not exceed 550 angstroms. Then, the film may be laminated in a reduced vapor deposition time, thereby reliably suppressing defects occurring with the amorphous selenium semiconductor film. Conversely, the gold thin film for the common electrode, at its thinnest, should not be less than 450 angstroms. Then, the common electrode has sufficient conductivity for reliably performing the expected function.

In an embodiment of the invention, the radiation detector further comprises a carrier selective intermediate layer formed between the amorphous selenium semiconductor film and the common electrode.

In this embodiment, dark current can be reduced since an infiltration of carriers that would form dark current is prevented by the carrier selective intermediate layer formed between the amorphous selenium semiconductor film and the common electrode. In this case, the common electrode is formed on the carrier selective intermediate layer. The gold thin film with a thickness not exceeding 1,000 angstroms serving as the common electrode may be formed at a relatively low vapor deposition temperature and in a short vapor deposition time. This results in a reduced chance of causing defects in the carrier selective intermediate layer. Further, the common electrode has an excellent bonding property with respect to the carrier selective intermediate layer. With the carrier selective intermediate layer serving as the ground, the bonding property of the common electrode is further improved.

In an embodiment of the invention, the radiation detector further comprises a plurality of collecting electrodes formed in a one-dimensional or two-dimensional matrix arrangement set to a radiation detection effective area, and a carrier selective intermediate layer formed between the amorphous selenium semiconductor film and the collecting electrodes.

In the construction having a carrier selective intermediate layer formed between the amorphous selenium semiconductor film and the common electrode, when a positive bias voltage is applied to the common electrode, the carrier selective intermediate layer is formed of a material having a contribution of electrons larger than a contribution of holes. This prevents an infiltration of holes from the common electrode, thereby reducing dark current.

Further, in the construction having a carrier selective intermediate layer formed between the amorphous selenium semiconductor film and the common electrode, when a negative bias voltage is applied to the common electrode, the carrier selective intermediate layer is formed of a material having a contribution of holes larger than a contribution of electrons. This prevents an infiltration of electrons from the common electrode, thereby reducing dark current.

In the construction having a carrier selective intermediate layer formed between the amorphous selenium semiconductor film and the collecting electrodes, when a positive bias voltage is applied to the common electrode, the carrier selective intermediate layer is formed of a material having a contribution of holes larger than a contribution of electrons. This prevents an infiltration of electrons from the collecting electrodes, thereby reducing dark current.

Further, in the construction having a carrier selective intermediate layer formed between the amorphous selenium semiconductor film and the collecting electrodes, when a negative bias voltage is applied to the common electrode, the carrier selective intermediate layer is formed of a material having a contribution of electrons larger than a contribution of holes. This prevents an infiltration of holes from the collecting electrodes, thereby reducing dark current.

The carrier selective intermediate layers in this invention should have a thickness in a range of 0.1 to 10 μm, and should be formed of a polycrystalline semiconductor such as $Sb_2S_3$, ZnTe, $CeO_2$, CdS, ZnSe or ZnS, or an amorphous semiconductor of selenium or selenium compound doped with an alkali metal such as Na, a halogen such as Cl, As or Te. These materials are desirable because of their excellent aptitude for increased area.

The carrier selective intermediate layers having a thickness of 0.1 to 10 μm can sufficiently suppress dark current without obstructing radiation detection. A thickness of the intermediate layers less than 0.1 μm tends to be incapable of suppressing dark current sufficiently. Conversely, a thickness exceeding 10 μm tends to obstruct radiation detection, e.g. tends to lower sensitivity.

In one specific example according to this invention, the radiation detector further comprises an active matrix substrate, the active matrix substrate including:

a plurality of collecting electrodes formed on a surface of the active matrix substrate, in a one-dimensional or two-dimensional arrangement set within a radiation detection effective area; and an electric circuit arranged on the active matrix substrate for storing and reading electric charges collected by the respective collecting electrodes;

the amorphous selenium semiconductor film being stacked on the surface, where the collecting electrodes are formed, of the active matrix substrate.

In this case, the electric charges generated in the radiation sensitive semiconductor upon incidence of the radiation are collected by the respective collecting electrodes formed on the surface of the active matrix substrate, in a one-dimensional or two-dimensional arrangement set within the radiation detection effective area. The electric charges are then outputted by the storing and reading electric circuit on the active matrix substrate as radiation detection signals for the respective collecting electrodes. That is, where the active matrix substrate is provided, this detector is a one-dimensional or two-dimensional array type radiation detector for detecting a one-dimensional or two-dimensional intensity distribution of the radiation projected to the radiation detection effective area.

The invention is not limited to the one-dimensional or two-dimensional array type radiation detector. The detector may be the non-array type having only one electrode for outputting radiation detection signals, i.e. a single collecting electrode.

Specific materials for forming the collecting electrodes include copper, aluminum, nickel, and ITO (indium tin oxide) which is a transparent conductive material.

The gate driver, charge-to-voltage converting amplifiers, multiplexer and analog-to-digital converter may be connected as separate, external devices to the active matrix substrate. Alternatively, certain or all of these components may be mounted in the active matrix substrate.

The amorphous selenium semiconductor film in this invention, preferably, is high purity amorphous selenium (a-Se), or an amorphous semiconductor of selenium or selenium compound doped with an alkali metal such as Na, a halogen such as Cl, As or Te. These materials are desirable because of their aptitude for increased area and increased thickness. High purity amorphous selenium, in particular, has an outstanding aptitude for increased area and increased film thickness.

Specifically, the amorphous selenium semiconductor film has a thickness in a range of 0.5 to 1.5 mm.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

First Embodiment

Figure 2:
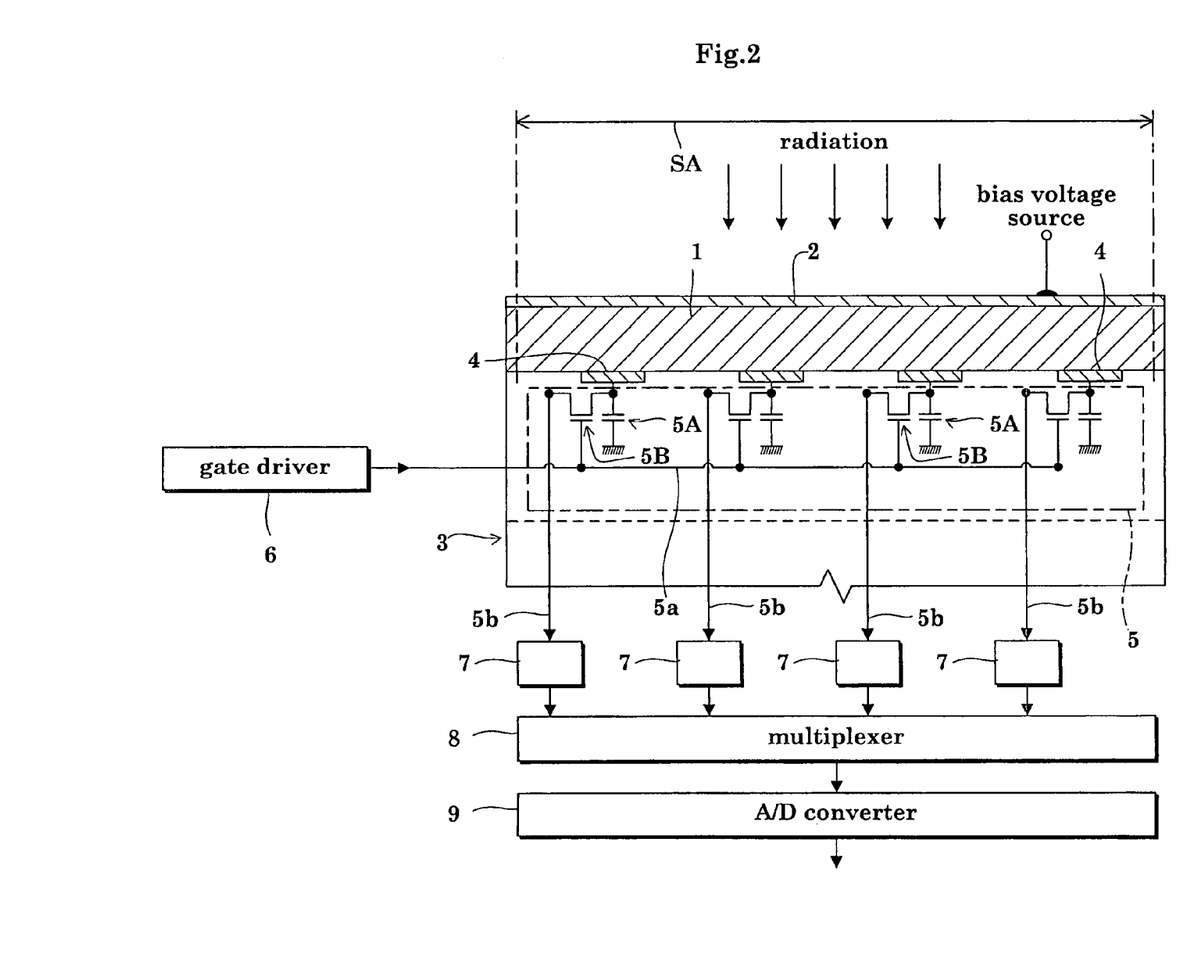
FIG. 2 is a block diagram showing, in section, a principal portion of a radiation detector in a first embodiment of the invention.
Figure 3:
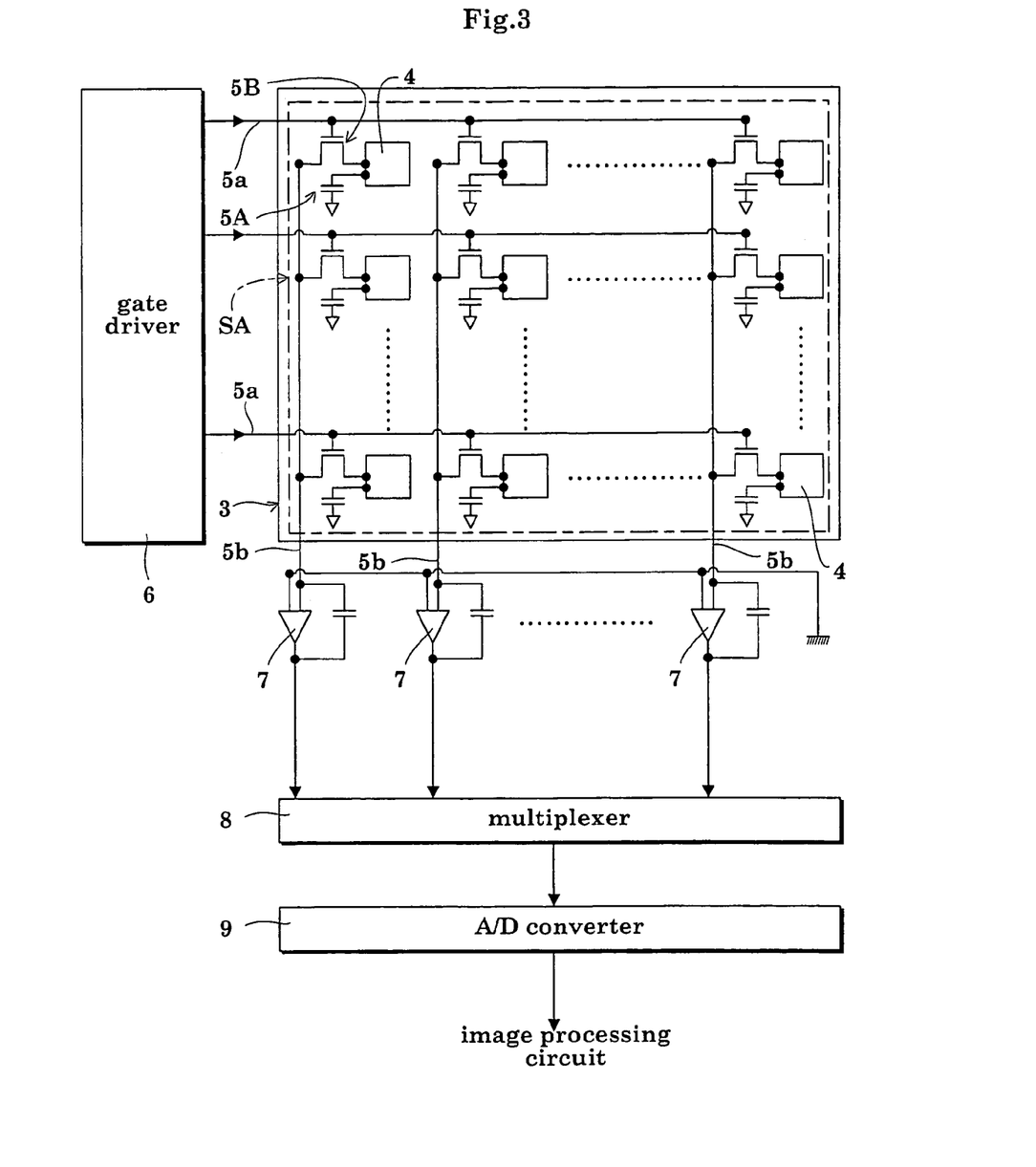
FIG. 3 is a block diagram showing electric circuits on and around an active matrix substrate of the radiation detector in the first embodiment.

A radiation detector embodying this invention will be described with reference to the drawings. FIG. 2 is a block diagram showing, in section, a principal portion of a radiation detector of the direct conversion type in a first embodiment of the invention. FIG. 3 is a block diagram showing electric circuits on and around an active matrix substrate of the detector in the first embodiment.

As shown in FIG. 2, the radiation detector in the first embodiment includes an amorphous selenium semiconductor film (a-Se semiconductor film) 1 sensitive to radiation, and a common electrode 2 for bias voltage application. The common electrode 2 for bias voltage application is formed two-dimensionally on the front surface of the a-Se semiconductor film 1. The detector in the first embodiment includes an active matrix substrate 3. As shown in FIG. 3, numerous collecting electrodes 4 are formed on the surface of the active matrix substrate 3 in a two-dimensional matrix arrangement set within a radiation detection effective area SA. An electric circuit 5 is arranged on the surface of the active matrix substrate 3 for storing and reading electric charges collected by the respective collecting electrodes 4. The a-Se semiconductor film 1 is laid on the surface of the active matrix substrate 3 where the collecting electrodes 4 are formed.

The storing and reading electric circuit 5 arranged on the active matrix substrate 3 includes capacitors 5A, TFTs (thin film field-effect transistors) 5B acting as switching elements, gate lines 5a and data lines 5b. One capacitor 5A and one TFT 5B are provided for each collecting electrode 4. Specifically, as shown in FIG. 2, the active matrix substrate 3 has, formed on an insulating substrate such as a glass substrate, the capacitors 5A and TFTs 5B for the storing and reading electric circuit 5, and the gate lines 5a and data lines 5b in a crisscross pattern. Further, the collecting electrodes 4 are formed on the surface in a two-dimensional matrix arrangement. The collecting electrodes 4 are not limited to a particular material, but may be formed of copper, aluminum, nickel, or ITO (indium tin oxide) which is a transparent conductive material.

Around the storing and reading electric circuit 5 on the active matrix substrate 3 are a gate driver 6, charge-to-voltage converting amplifiers 7, a multiplexer 8 and an analog-to-digital converter 9 connected as external devices. Certain or all of the gate driver 6, charge-to-voltage converting amplifiers 7, multiplexer 8 and analog-to-digital converter 9 may be built into the active matrix substrate 3, instead of being external devices.

In time of radiation detection by the detector in the first embodiment, a bias voltage of several kilovolts to tens of kilovolts outputted from a bias voltage source (not shown) is applied to the common electrode 2. With the bias voltage applied, the radiation sensitive a-Se semiconductor film 1 generates electric charges upon incidence of the radiation to be detected. The electric charges generated in the a-Se semiconductor 1 are collected by the respective collecting electrodes 4. More particularly, electric charges are induced in the collecting electrodes 4 by movement to the respective collecting electrodes 4. The electric charge collected in each collecting electrode 4 is fetched by the storing and reading electric circuit 5 on the active matrix substrate 3 as a radiation detection signal for each collecting electrode 4.

Specifically, as the gate driver 6 successively applies read signals via gate lines 5a to the gates of the respective TFTs 6B, the data lines 5b connected to the sources of the TFTs 5B receiving the read signals are successively switched and connected through the charge-to-voltage converting amplifiers 7 to the multiplexer 8. With this switching connection, the electric charges stored in the capacitors 5A are transmitted from TFTs 5B through the data lines 5b, amplified by the charge-to-voltage converting amplifiers 7, and outputted from the multiplexer 8 as radiation detection signals for the respective collecting electrodes 4 to the analog-to-digital converter 9 to be digitized therein.

Where, for example, the detector in the first embodiment is provided for a fluoroscopic apparatus, the radiation detection signals outputted from the analog-to-digital converter 9 of the detector are transmitted to an image processing circuit disposed at a subsequent stage to create a two-dimensional fluoroscopic image or the like.

That is, in the radiation detector of the direct conversion type in the first embodiment, each of the collecting electrodes 5 in the two-dimensional matrix arrangement acts as an electrode corresponding to each pixel in a radiographic image (pixel electrode). This detector is a radiographic imaging device of the two-dimensional array type for providing radiation detection signals for use in creating a radiographic image according to a two-dimensional intensity distribution of the radiation projected to the radiation detection effective area SA.

Each component of the detector in the first embodiment will be described in greater detail hereinafter.

The detector in the first embodiment has the common electrode 2 for bias voltage application formed two-dimensionally over a large area on the front surface of the a-Se semiconductor film 1 sensitive to radiation. The common electrode 2 is a gold thin film (Au thin film) having a thickness of 100 to 1,000 Å (angstroms). This is a salient characteristic of the construction. The a-Se semiconductor film 1 has an excellent aptitude for area enlargement, and thus a large radiation detection effective area SA may be secured easily. However, the a-Se semiconductor film 1 has heretofore been found vulnerable to defects due to the heat generated in time of vapor-deposition of the common electrode 2. Further, the common electrode 2 has proved insufficient in bonding strength.

In the detector in the first embodiment, the common electrode 2 is a gold thin film with a thickness not exceeding 1,000 Å. The gold thin film serving as the common electrode 2 may be formed on the front surface of a-Se semiconductor film 1 at a relatively low vapor deposition temperature and in a short vapor deposition time. This results in a reduced chance of causing defects in the a-Se semiconductor film 1. That is, gold used as the material for forming the common electrode 2 has a low melting point, and thus does not require a high vapor deposition temperature. Gold has a very high degree of conductivity, and the conductivity required of the common electrode 2 may be secured even with a 100 Å gold thin film accompanied by an increase in electrode resistance, and thus requires only a short vapor deposition time. Since the a-Se semiconductor film 1 is a film of high resistance, the resistance of the common electrode 2 increases somewhat. However, this presents no problem electrically, in view of the conductivity of gold.

Further, the gold thin film forming the common electrode 2 is not so thick as in the prior art, but is very thin, i.e. 1,000 Å or less. Thus, the common electrode 2 has an improved bonding property with respect to the a-Se semiconductor film 1.

Platinum (Pt) has the advantage of requiring only a low vapor deposition temperature, as does gold. However, platinum has a low conductivity of about one fifth that of gold. When used as the material for the common electrode, platinum must be deposited thick in order to secure the conductivity required of the common electrode 2. This results in an extended vapor deposition time, thereby causing defects in the a-Se semiconductor film 1. In addition, the film will become thick and the common electrode 2 will have an unsatisfactory boding property.

The gold thin film forming the common electrode 2, preferably, has a thickness in a range of 450 to 550 Å. The gold thin film, even when formed thick, should not exceed 550 Å. Then, the film may be formed in a reduced vapor deposition time, thereby reliably suppressing defects occurring with the a-Se semiconductor film 1. Conversely, the gold thin film for the common electrode 2, at its thinnest, should not be less than 450 Å. Then, the common electrode 2 has sufficient conductivity for reliably performing the expected function. The gold thin film for the common electrode 2 may be formed, with no special difficulty, by vacuum deposition of the ordinary resistance heating method.

The a-Se semiconductor film 1 of the detector in the first embodiment may be, apart from high purity amorphous selenium, an amorphous semiconductor of selenium or selenium compound doped with an alkali metal such as Na, a halogen such as Cl, As or Te. These materials are desirable because of their excellent aptitude for increased area and increased film thickness. High purity amorphous selenium, in particular, has an outstanding aptitude for increased area and increased film thickness. The a-Se semiconductor film 1 usually has a thickness of 0.5 to 1.5 mm and an area of 20 to 40 cm by 20 cm to 40 cm, for example. However, these measures are not limitative.

A phenomenon such as an increase in leak current has been noted with conventional detectors. It has been confirmed that the detector in the first embodiment realizes a reduction of leak current.

From the above result of confirmation, it is seen that the common electrode 2 formed of a gold thin film with a thickness not exceeding 1,000 Å is effective for sufficiently suppressing defects of the a-Se semiconductor film 1 resulting from lamination thereon of the common electrode 2.

Second Embodiment

Figure 4:
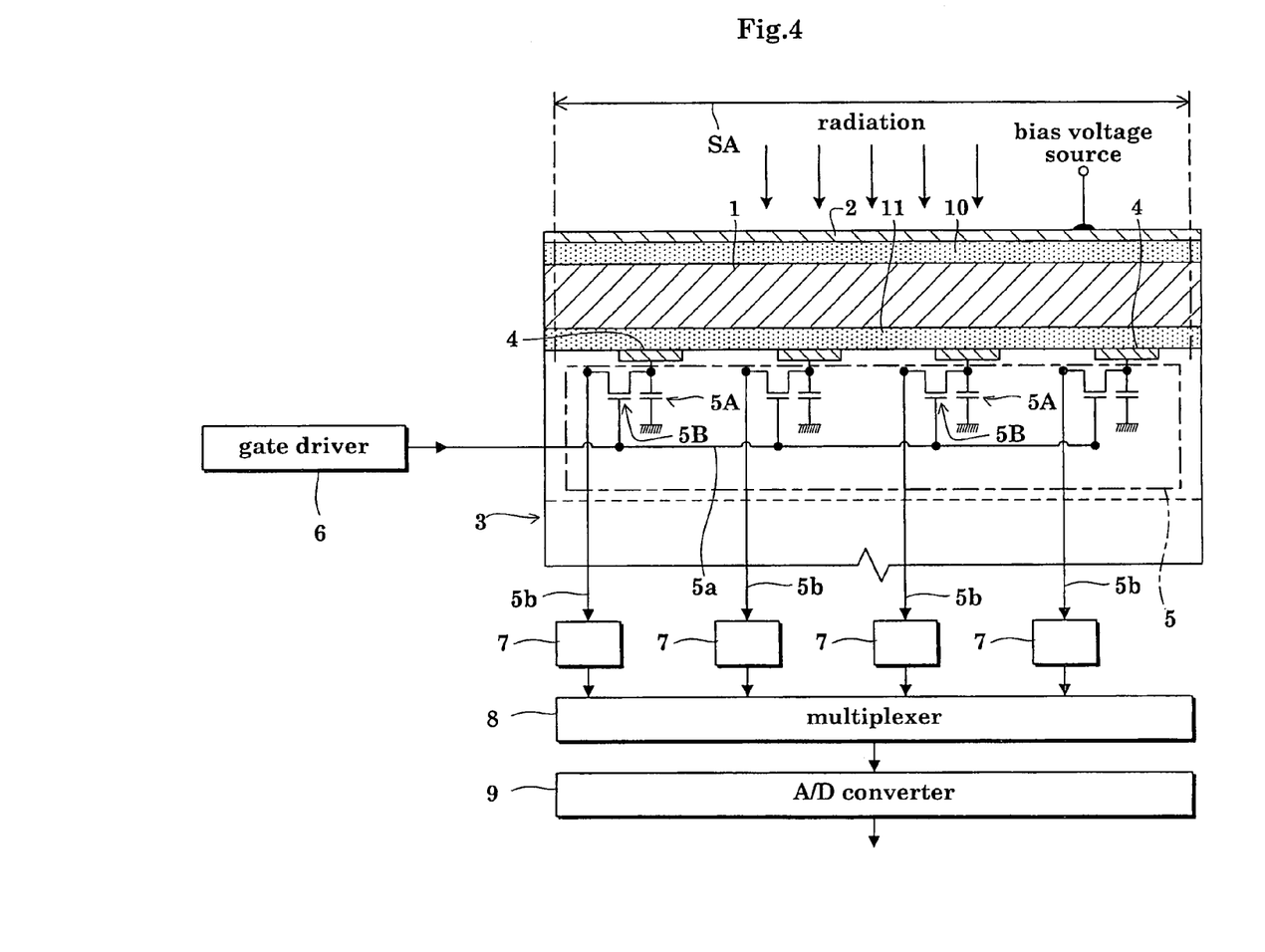
FIG. 4 is a block diagram showing, in section, a principal portion of a radiation detector in a second embodiment of the invention.

A radiation detector in a second embodiment will be described with reference to the drawings. FIG. 4 is a block diagram showing, in section, a principal portion of a radiation detector of the direct conversion type in the second embodiment of the invention.

As shown in FIG. 4, the radiation detector in the second embodiment includes a carrier selective intermediate layer 10 formed between the a-Se semiconductor film 1 and common electrode 2, and a carrier selective intermediate layer 11 formed between the a-Se semiconductor film 1 and collecting electrodes 4. The other aspects are the same as in the detector in the first embodiment. Only different features will be described below, and the common features will not be described again.

The detector in the second embodiment, with the carrier selective intermediate layers 10 and 11, can reduce dark current. The detector in the second embodiment has the common electrode 2 formed on the carrier selective intermediate layer 10. The gold thin film with a thickness not exceeding 1,000 Å serving as the common electrode 2 may be formed at a relatively low vapor deposition temperature and in a short vapor deposition time. This results in a reduced chance of causing defects in the carrier selective intermediate layer 10 and other components. Further, the common electrode 2 has an excellent bonding property with respect to the carrier selective intermediate layer 10. With the carrier selective intermediate layer 10 serving as the ground, the bonding property of common electrode 2 is further improved.

The carrier selectivity here refers to a property of being remarkably different in contribution to the charge transfer action between electrons and holes which are charge transfer media (carriers) in a semiconductor.

Generally, where a positive bias voltage is applied to the common electrode 2, the carrier selective intermediate layer 10 is formed of a material having a greater contribution of electrons than of holes. This prevents infiltration of holes from the common electrode 2 to reduce dark current. The carrier selective intermediate layer 11 is formed of a material having a greater contribution of holes than of electrons. This prevents an infiltration of electrons from the collecting electrodes 4 to reduce dark current.

Conversely, where a negative bias voltage is applied to the common electrode 2, the carrier selective intermediate layer 10 is formed of a material having a greater contribution of holes than of electrons. This prevents an infiltration of electrons from the common electrode 2 to reduce dark current. The carrier selective intermediate layer 11 is formed of a material having a greater contribution of electrons than of holes. This prevents an infiltration of holes from the collecting electrodes 4 to reduce dark current.

An appropriate thickness of the carrier selective intermediate layers 10 and 11 is in the range of 0.1 to 10 μm. A thickness of the intermediate layers 10 and 11 less than 0.1 μm tends to be incapable of suppressing dark current sufficiently. Conversely, a thickness exceeding 10 μm tends to obstruct radiation detection, e.g. tends to lower sensitivity.

A semiconductor used for the carrier selective intermediate layers 10 and 11 may be a polycrystalline semiconductor such as $Sb_2S_3$, ZnTe, $CeO_2$, CdS, ZnSe or ZnS, or an amorphous semiconductor of selenium or selenium compound doped with an alkali metal such as Na, a halogen such as Cl, As or Te. These materials are desirable because of their excellent aptitude for increased area.

Among the semiconductors usable for the intermediate layers 10 and 11, those having a large contribution of electrons are n-type semiconductors including polycrystalline semiconductors such as $CeO_2$, CdS, CdSe, ZnSe and ZnS, and amorphous materials such as amorphous selenium doped with an alkali metal, As or Te to reduce the contribution of holes.

Those having a large contribution of holes are p-type semiconductors including polycrystalline semiconductors such as ZnTe, and amorphous materials such as amorphous selenium doped with a halogen to reduce the contribution of electrons.

Further, $Sb_2S_3$, CdTe, CdZnTe, $PbI_2$, $HgI_2$, TlBr, non-doped amorphous selenium or selenium compounds include the type having a large contribution of electrons and the type having a large contribution of holes. Either type, whether having a large contribution of electrons or having a large contribution of holes, may be selected for use as long as film forming conditions are adjusted.

This invention is not limited to the above embodiments, but may be modified as follows:

(1) The detectors in the first and second embodiments are the two-dimensional array type. The radiation detectors according to this invention may be the one-dimensional array type having collecting electrodes formed in a one-dimensional matrix array, or the non-array type having a single electrode (collecting electrode) for outputting radiation detection signals.

(2) The detectors in the first and second embodiments include the analog-to-digital converter 9 besides the gate driver 6, charge-to-voltage converting amplifiers 7 and multiplexer 8. The invention may provide modified detectors having the same constructions as in the first and second embodiments, except that certain or all of the gate driver 6, charge-to-voltage converting amplifiers 7, multiplexer 8 and analog-to-digital converter 9 are omitted.

(3) The detector in the second embodiment has carrier selective intermediate layers formed between the a-Se semiconductor film 1 and common electrode 2, and between the a-Se semiconductor film 1 and collecting electrodes 4. The detector may be modified to include only one carrier selective intermediate layer either between the a-Se semiconductor film 1 and common electrode 2, or between the a-Se semiconductor film 1 and collecting electrodes 4.

This invention may be embodied in other specific forms without departing from the spirit or essential attributes thereof and, accordingly, reference should be made to the appended claims, rather than to the foregoing specification, as indicating the scope of the invention.

What is claimed is:

1. A radiation detector having an amorphous selenium semiconductor film sensitive to radiation, and a common electrode for bias voltage application formed two-dimensionally on a front surface of the radiation sensitive amorphous selenium semiconductor film, electric charges being generated in the radiation sensitive amorphous selenium semiconductor film upon incidence of radiation to be detected, with a bias voltage applied to the common electrode:
   wherein said common electrode comprises a gold thin film (Au thin film) having a thickness of 100 to 1,000 angstroms.

2. A radiation detector as defined in claim 1, wherein said gold thin film has a thickness in a range of 450 to 550 angstroms.

3. A radiation detector as defined in claim 1, further comprising a carrier selective intermediate layer formed between said amorphous selenium semiconductor film and said common electrode.

4. A radiation detector as defined in claim 3, wherein, when a positive bias voltage is applied to said common electrode, said carrier selective intermediate layer is formed of a material having a contribution of electrons larger than a contribution of holes.

5. A radiation detector as defined in claim 3, wherein, when a negative bias voltage is applied to said common electrode, said carrier selective intermediate layer is formed of a material having a contribution of holes larger than a contribution of electrons.

6. A radiation detector as defined in claim 3, wherein said intermediate layer has a thickness in a range of 0.1 to 10 μm.

7. A radiation detector as defined in claim 3, wherein said intermediate layer is one of a polycrystalline semiconductor such as $Sb_2S_3$, ZnTe, $CeO_2$, CdS, ZnSe or ZnS, and an amorphous semiconductor of selenium or selenium compound doped with an alkali metal such as Na, a halogen such as Cl, As or Te.

8. A radiation detector as defined in claim 1, further comprising:
   a plurality of collecting electrodes formed in a one-dimensional or two-dimensional matrix arrangement set to a radiation detection effective area; and
   a carrier selective intermediate layer formed between said amorphous selenium semiconductor film and said collecting electrodes.

9. A radiation detector as defined in claim 8, wherein, when a positive bias voltage is applied to said common electrode, said carrier selective intermediate layer is formed of a material having a contribution of holes larger than a contribution of electrons.

10. A radiation detector as defined in claim 8, wherein, when a negative bias voltage is applied to said common electrode, said carrier selective intermediate layer is formed of a material having a contribution of electrons larger than a contribution of holes.

11. A radiation detector as defined in claim 8, wherein said intermediate layer has a thickness in a range of 0.1 to 10 μm.

12. A radiation detector as defined in claim 8, wherein said intermediate layer is one of a polycrystalline semiconductor such as $Sb_2S_3$, ZnTe, $CeO_2$, CdS, ZnSe or ZnS, and an amorphous semiconductor of selenium or selenium compound doped with an alkali metal such as Na, a halogen such as Cl, As or Te.

13. A radiation detector as defined in claim 1, further comprising an active matrix substrate, said active matrix substrate including:

a plurality of collecting electrodes formed on a surface of the active matrix substrate, in a one-dimensional or two-dimensional arrangement set within a radiation detection effective area; and an electric circuit arranged on the active matrix substrate for storing and reading electric charges collected by the respective collecting electrodes;

said amorphous selenium semiconductor film being stacked on the surface, where the collecting electrodes are formed, of the active matrix substrate.

14. A radiation detector as defined in claim 13, wherein said collecting electrodes are formed of one of copper, aluminum, nickel and indium tin oxide.

15. A radiation detector as defined in claim 13, further comprising:

a gate driver for applying read signals for reading the electric charges collected by said collecting electrodes;

charge-to-voltage converting amplifiers for amplifying the electric charges read;

a multiplexer for switching connections for reading; and an analog-to-digital converter for digitizing amplified electric charges into radiation detection signals;

said gate driver, said charge-to-voltage converting amplifiers, said multiplexer and said analog-to-digital converter being connected as separate, external devices to said active matrix substrate.

16. A radiation detector as defined in claim 13, further comprising:

a gate driver for applying read signals for reading the electric charges collected by said collecting electrodes;

charge-to-voltage converting amplifiers for amplifying the electric charges read;

a multiplexer for switching connections for reading; and an analog-to-digital converter for digitizing amplified electric charges into radiation detection signals;

certain or all of said gate driver, said charge-to-voltage converting amplifiers, said multiplexer and said analog-to-digital converter being mounted in said active matrix substrate.

17. A radiation detector as defined in claim 1, further comprising an active matrix substrate, said active matrix substrate including:

a collecting electrode formed on a surface of the active matrix substrate and set within a radiation detection effective area; and an electric circuit arranged on the active matrix substrate for storing and reading electric charges collected by the collecting electrode;

said amorphous selenium semiconductor film being stacked on the surface, where the collecting electrode is formed, of the active matrix substrate;

said active matrix substrate being a non-array type.

18. A radiation detector as defined in claim 1, wherein said amorphous selenium semiconductor film is one of high purity amorphous selenium (a-Se), and an amorphous semiconductor of selenium or selenium compound doped with an alkali metal such as Na, a halogen such as Cl, As or Te.

19. A radiation detector as defined in claim 1, wherein said amorphous selenium semiconductor film has a thickness in a range of 0.5 to 1.5 mm.

* * * * *